United States Patent
Minami

(10) Patent No.: US 11,415,603 B2
(45) Date of Patent: Aug. 16, 2022

(54) CIRCUIT FOR DETECTING CURRENT FLOWING TO LOAD, USING SHUNT RESISTOR

(71) Applicant: CANON KABUSHIKI KAISHA, Tokyo (JP)

(72) Inventor: Yutaro Minami, Tokyo (JP)

(73) Assignee: Canon Kabushiki Kaisha, Tokyo (JP)

(*) Notice: Subject to any disclaimer, the term of this patent is extended or adjusted under 35 U.S.C. 154(b) by 16 days.

(21) Appl. No.: 17/155,255

(22) Filed: Jan. 22, 2021

(65) Prior Publication Data
US 2021/0231708 A1 Jul. 29, 2021

(30) Foreign Application Priority Data
Jan. 23, 2020 (JP) ............... JP2020-009445

(51) Int. Cl.
*G01R 15/00* (2006.01)
*H03F 3/45* (2006.01)
*G01R 19/00* (2006.01)

(52) U.S. Cl.
CPC ....... *G01R 15/005* (2013.01); *G01R 19/0092* (2013.01); *H03F 3/45475* (2013.01); *H03F 2200/129* (2013.01); *H03F 2203/45528* (2013.01); *H03F 2203/45594* (2013.01)

(58) Field of Classification Search
CPC ............. G01R 15/005; G01R 19/023; G01R 19/0092; H03F 2203/45528
See application file for complete search history.

(56) References Cited

U.S. PATENT DOCUMENTS

| | | | |
|---|---|---|---|
| 7,570,114 B2* | 8/2009 | Tansley | H03F 3/45085 330/258 |
| 2011/0089931 A1* | 4/2011 | Podlisk | G01R 1/203 324/126 |
| 2013/0057275 A1* | 3/2013 | Tamura | B60L 3/0038 324/252 |
| 2014/0145649 A1* | 5/2014 | Atsuta | H02N 2/142 318/116 |
| 2015/0219690 A1* | 8/2015 | Kaya | G01R 19/0092 324/126 |
| 2021/0006065 A1 | 1/2021 | Minami | |
| 2021/0055683 A1 | 2/2021 | Minami | |

FOREIGN PATENT DOCUMENTS

JP 2001-083183 A 3/2001

* cited by examiner

*Primary Examiner* — Dominic E Hawkins
(74) *Attorney, Agent, or Firm* — Venable LLP

(57) ABSTRACT

A shunt resistor is connected in series to a load. A differential amplifier circuit are inputted a first voltage that is generated at one end of the shunt resistor and a second voltage that is generated at the other end of the shunt resistor. The differential amplifier circuit outputs a third voltage equivalent to a sum of a reference voltage and a voltage obtained by performing differential amplification on the first voltage and the second voltage. A conversion circuit outputs the voltage obtained by performing differential amplification on the first voltage and the second voltage by removing the reference voltage from the third voltage. The voltage is proportional to a load current.

12 Claims, 4 Drawing Sheets

CIRCUIT FOR DETECTING CURRENT FLOWING TO LOAD, USING SHUNT RESISTOR

BACKGROUND OF THE INVENTION

Field of the Invention

The present invention relates to a circuit for detecting a current flowing to a load, using a shunt resistor.

Description of the Related Art

According to Japanese Patent Laid-Open No. 2001-083183, a circuit for detecting a current flowing to a load, using a shunt resistor is proposed. Specifically, a voltage generated at one end of the shunt resistor is divided by a voltage dividing circuit, and an output voltage of the voltage dividing circuit is subjected to conversion by an impedance conversion circuit. A voltage generated at the other end of the shunt resistor is divided by another voltage dividing circuit similarly, and an output voltage of this voltage dividing circuit is subjected to conversion by another impedance conversion circuit. As a result of a differential amplifier circuit amplifying the voltages output from the two impedance conversion circuits, a voltage proportional to a load current is obtained. Note that each impedance conversion circuit includes an operational amplifier. The upper limit value of a voltage that can be input (withstand voltage) to the operational amplifier is specified. In view of this, the voltage dividing circuit reduces the voltage of the shunt resistor and generates an input voltage that is to be input to the operational amplifier, so as to not exceed the withstand voltage of the operational amplifier.

The voltage dividing circuit is formed of a plurality of resistors, which have manufacturing variations (individual differences). The accuracy of current detection performed by a current detection circuit described in Japanese Patent Laid-Open No. 2001-083183 is likely to be affected by a margin of error in each resistor constituting the voltage dividing circuit.

SUMMARY OF THE INVENTION

The present invention provides a current detection apparatus comprising: a shunt resistor that is connected in series to a load; a differential amplifier circuit to which a first voltage that is generated at one end of the shunt resistor and a second voltage that is generated at the other end of the shunt resistor are input, and that performs differential amplification on the first voltage and the second voltage, and outputs a voltage correlated with a load current flowing to the load; a reference voltage source that generates a reference voltage; and a conversion circuit that is connected downstream of the differential amplifier circuit, and converts a level of a voltage that is output from the differential amplifier circuit, wherein the differential amplifier circuit includes a first operational amplifier that includes a negative power supply terminal to which the reference voltage is applied from the reference voltage source, and the differential amplifier circuit is configured to output a third voltage equivalent to a sum of the reference voltage and a voltage obtained by performing differential amplification on the first voltage and the second voltage, and the conversion circuit is configured to output the voltage obtained by performing differential amplification on the first voltage and the second voltage, the voltage being proportional to the load current, by removing the reference voltage from the third voltage.

Further features of the present invention will become apparent from the following description of exemplary embodiments (with reference to the attached drawings).

DESCRIPTION OF THE EMBODIMENTS

Figure 1:
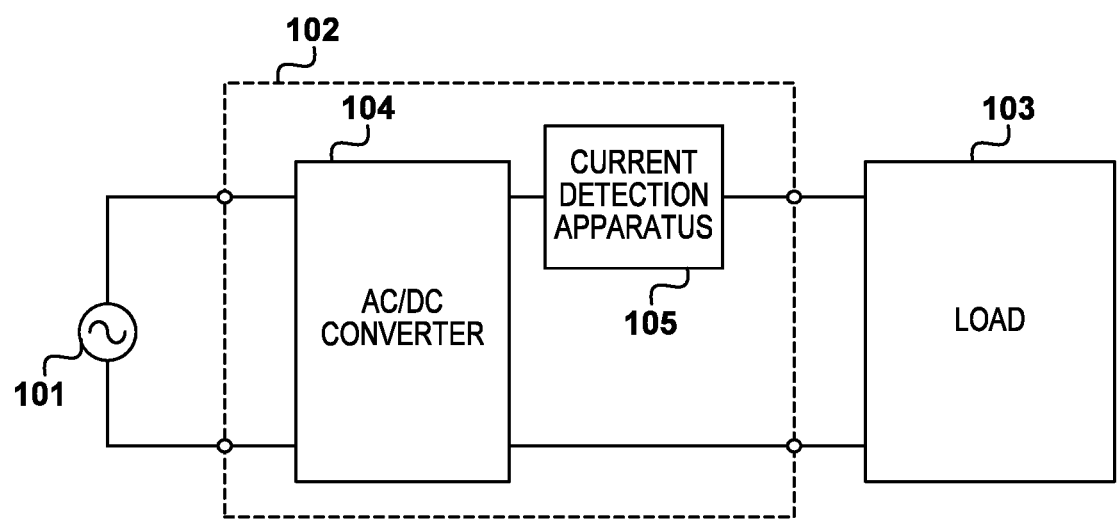
FIG. 1 is a diagram illustrating a power supply apparatus.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

As shown in FIG. 1, a commercial power supply 101 is an AC power supply that supplies AC power to a power supply apparatus 102. The power supply apparatus 102 converts the AC power supplied from the commercial power supply 101, into DC power, and supplies the DC power to a load 103. The load 103 is, for example, a motor (DC brushless motor, stepping motor, or the like) that operates using a DC voltage for driving rollers for conveying a sheet in an image forming apparatus. The power supply apparatus 102 includes an AC/DC converter 104 and a current detection apparatus 105. The AC/DC converter 104 is a power supply circuit that converts an AC current into a DC current. The current detection apparatus 105 detects a load current flowing to the load 103. One end of the current detection apparatus 105 is connected to the AC/DC converter 104. The other end of the current detection apparatus 105 is connected to the load 103.

Comparison Example

Figure 2:
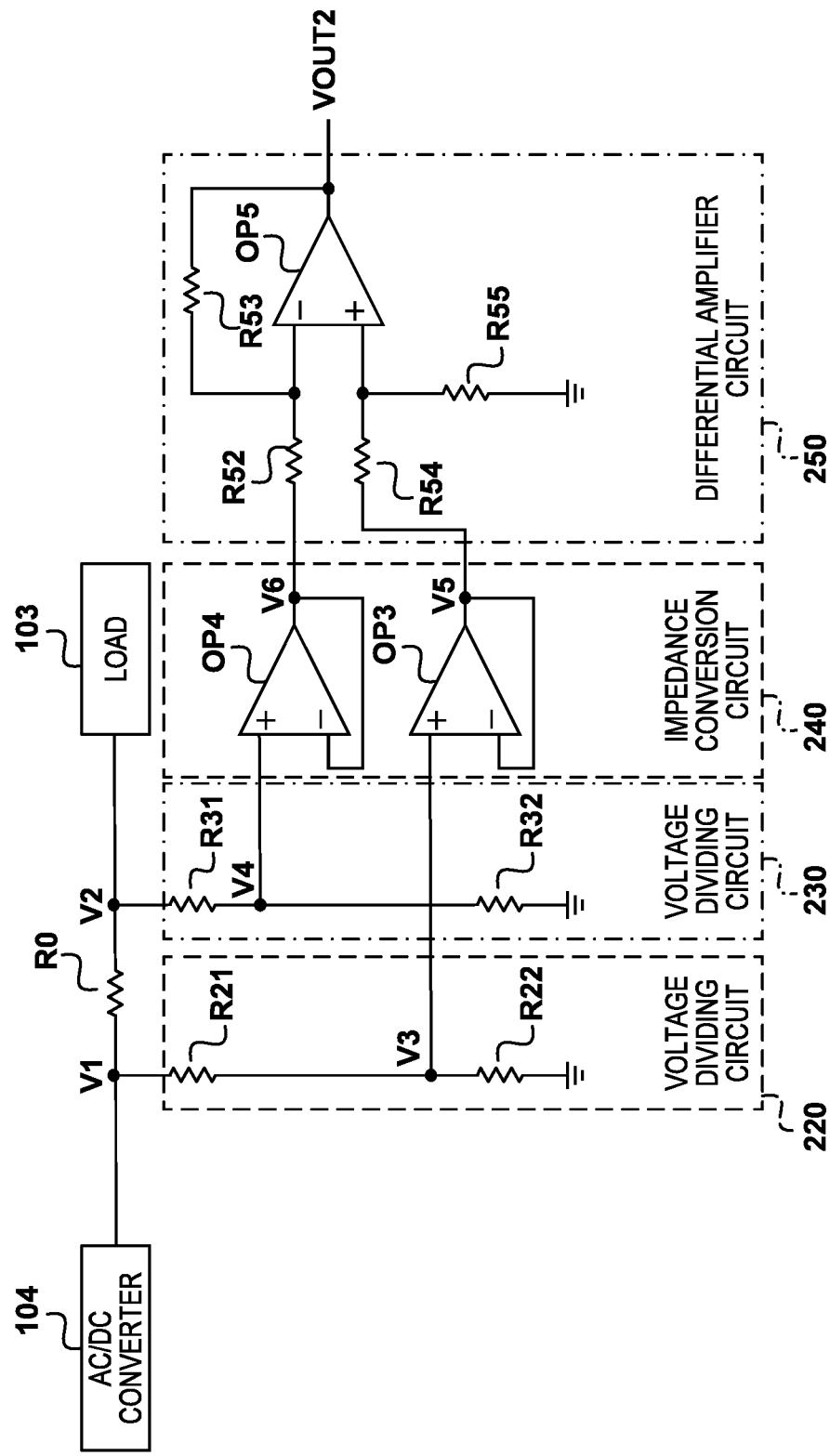
FIG. 2 is a diagram showing a current detection apparatus of a comparison example.

FIG. 2 is a circuit diagram showing the current detection apparatus 105 as a comparison example. A shunt resistor R0 is provided on a line through which a load current flows from the AC/DC converter 104 to the load 103. Accordingly, the shunt resistor R0 is connected in series to the load 103.

A voltage dividing circuit 220 divides the potential (voltage V1) at one end of the shunt resistor R0 (upstream) using resistors R21 and R22 so as to generate a voltage V3. A voltage dividing circuit 230 generates a voltage V4 by dividing the potential (voltage V2) at the other end of the shunt resistor R0 (downstream) using resistors R31 and R32. As is clear from FIG. 2, the voltage V1 is higher than the voltage V2. An impedance conversion circuit 240 converts an output impedance of the voltage dividing circuit 220 and an output impedance of the voltage dividing circuit 230 into impedances that are higher than an input impedance of a differential amplifier circuit 250. The impedance conversion circuit 240 includes an operational amplifier OP3 and an operational amplifier OP4 that function as voltage followers. The differential amplifier circuit 250 is a circuit that amplifies a voltage that is a difference between a voltage V5 output from the operational amplifier OP3 and a voltage V6 output from the operational amplifier OP4, and generates an output voltage VOUT2. The differential amplifier circuit 250 includes resistors R52, R53, R54, and R55 and an operational amplifier OP5.

The withstand voltage of a general-purpose operational amplifier is usually 32 V. Therefore, if the voltage V1 that is output from the AC/DC converter 104 is higher than 32 V, the voltage dividing circuits 220 and 230 are necessary. The voltage dividing circuit 220 divides the voltage V1 and generates the voltage V3 that is to be input to the non-inverting input terminal of the operational amplifier OP3, and that is lower than or equal to the withstand voltage. Similarly, the voltage dividing circuit 230 divides the voltage V2 and generates the voltage V4 that is to be input to the non-inverting input terminal of the operational amplifier OP4, and that is lower than or equal to the withstand voltage.

For example, assume that the voltage V1 is 40 V, the resistance values of the resistors R21, R22, R31, and R32 are 1 kΩ, and voltage drop (V1-V2) caused by a current flowing to the shunt resistor R0 is 0.5 V. Under this assumption, the voltage V3 is 20 V, and the voltage V4 is 19.75 V. Thus, both the voltages V3 and V4 are lower than or equal to the withstand voltage of the operational amplifier, which is 32 V.

A voltage that is input to the non-inverting input terminal of the operational amplifier OP5 in the differential amplifier circuit 250 and a voltage that is input to the inverting input terminal are voltages obtained by dividing the voltage V5 output from the operational amplifier OP3, respectively using the resistor R54 and the resistor R55, and thus these voltages are lower than the voltage V3 of the non-inverting input terminal of the operational amplifier OP3. Therefore, a general-purpose operational amplifier whose withstand voltage is 32 V can be adopted as the operational amplifier OP5. If high-voltage resistant operational amplifiers are adopted as the operational amplifiers OP3, OP4, and OP5, the voltage dividing circuit 220, the voltage dividing circuit 230, and the impedance conversion circuit 240 can be omitted. However, a high-voltage resistant operational amplifier is expensive.

In the current detection apparatus 105 of the comparison example shown in FIG. 2, if resistance errors of the resistors R21, R22, R31, and R32 are large, the accuracy of current detection deteriorates largely. Therefore, the current detection apparatus 105 of the comparison example cannot accurately detect a load current.

Current Detection Accuracy of Comparison Example

As an example, assume that the voltage V1 is 40 V, and voltage drop (V1-V2) is 0.5 V. Assume that resistance errors of the resistors used in the voltage dividing circuit 220, the voltage dividing circuit 230, and the differential amplifier circuit 250 are 0.5%. The resistance values of the resistors in the voltage dividing circuit 220, the voltage dividing circuit 230, and the differential amplifier circuit 250 are set such that the output voltage VOUT2 is 5 V, by multiplying 0.5 V, which is voltage drop caused by the shunt resistor R0, by 10. Specifically, the resistance values of the resistors R21, R22, R31, and R32 are all set to 1 kΩ. The resistance values of the resistors R52 and R54 are 1 kΩ. The resistance values of the resistors R53 and R55 are 20 kΩ. The shunt resistor R0 is adopted in the comparison example and an embodiment of the present invention in common, and thus the resistance error of the shunt resistor R0 is ignored.

Under this assumption, the voltage difference (V3-V4) between the voltage V3 of the non-inverting input terminal of the operational amplifier OP3 and the voltage V4 of the non-inverting input terminal of the operational amplifier OP4 is 0.25 V. As described above, the impedance conversion circuit 240 functions as a voltage follower. As is well known, the voltage of the input terminal of a voltage follower and the voltage of the output terminal of the voltage follower are the same. Therefore, the voltage V5 of the output terminal of the operational amplifier OP3 is equal to the voltage V3 (=20 V). Similarly, the voltage V6 of the output terminal of the operational amplifier OP4 is equal to the voltage V4 (=19.75 V).

The voltage V5 generated at the output terminal of the operational amplifier OP3 and the voltage V6 generated at the output terminal of the operational amplifier OP4 are input to the differential amplifier circuit 250. The output voltage VOUT2 of the differential amplifier circuit 250 is obtained based on the following equation.

$$VOUT2=\{(R52+R53)/R52\}\cdot\{R55/(R54+R55)\}\cdot V5-(R53/R52)\cdot V6 \quad (1)$$

Here, R52 indicates the resistance value of the resistor R52. R53 indicates the resistance value of the resistor R53. R54 indicates the resistance value of the resistor R54. R55 indicates the resistance value of the resistor R55. If the resistance values are substituted in Expression 1, the output voltage VOUT2 of the differential amplifier circuit 250 is calculated to be 5 V.

Here, the output voltage VOUT2 is recalculated by taking the resistance errors within the voltage dividing circuit 220, the voltage dividing circuit 230, and the differential amplifier circuit 250 into consideration. When the voltage difference (V3-V4) between the voltage V3 and the voltage V4 is maximum, the resistance values of the resistor R21 and R32 are 0.995 kΩ, and the resistance values of the resistors R22 and R31 are 1.005 kΩ. At this time, the voltage difference (V3-V4) is 0.449 V.

On the other hand, when the voltage difference (V3-V4) between the voltage V3 and the voltage V4 is minimum, the resistance values of the resistor R21 and R32 are 1.005 kΩ, and the resistance values of the resistor R22 and R31 are 0.995 kΩ. At this time, the voltage difference (V3-V4) is 0.052 V.

When the output voltage VOUT2 is maximum, the resistance value of the resistor R52 is 1.005 kΩ, the resistance value of the resistor R53 is 19.90 kΩ, the resistance value of the resistor R54 is 0.995 kΩ, the resistance value of the resistor R55 is 20.10 kΩ, and the voltage difference (V3-V4) is the maximum value, which is 0.449 V. In this case, the output voltage VOUT2 is 9.26 V.

On the other hand, when the output voltage VOUT2 is minimum, the resistance value of the resistor R52 is 0.995 kΩ, the resistance value of the resistor R53 is 20.10 kΩ, the resistance value of the resistor R54 is 1.005 kΩ, the resistance value of the resistor R55 is 19.90 kΩ, and the voltage difference (V3-V4) is the minimum value, which is 0.052 V. At this time, the output voltage VOUT2 is 0.65 V.

As described above, in the current detection apparatus 105 of the comparison example, the true value of the output voltage VOUT2 is 5 V. Thus, the error rate of current detection is -86.95 to 85.30%. In this manner, the accuracy of current detection performed by the current detection apparatus 105 of the comparison example is poor, and a load current cannot be accurately detected. The true value of the voltage difference (V3-V4) is 0.25 V, and thus the error rate of the voltage difference (V3-V4) is -79.5 to 79.5%. It can be seen that the main cause for the deterioration in the accuracy of current detection that is performed by the current detection apparatus 105 of the comparison example is resistance errors of the resistors constituting the voltage dividing circuit 220 and the voltage dividing circuit 230.

Embodiment

Figure 3:
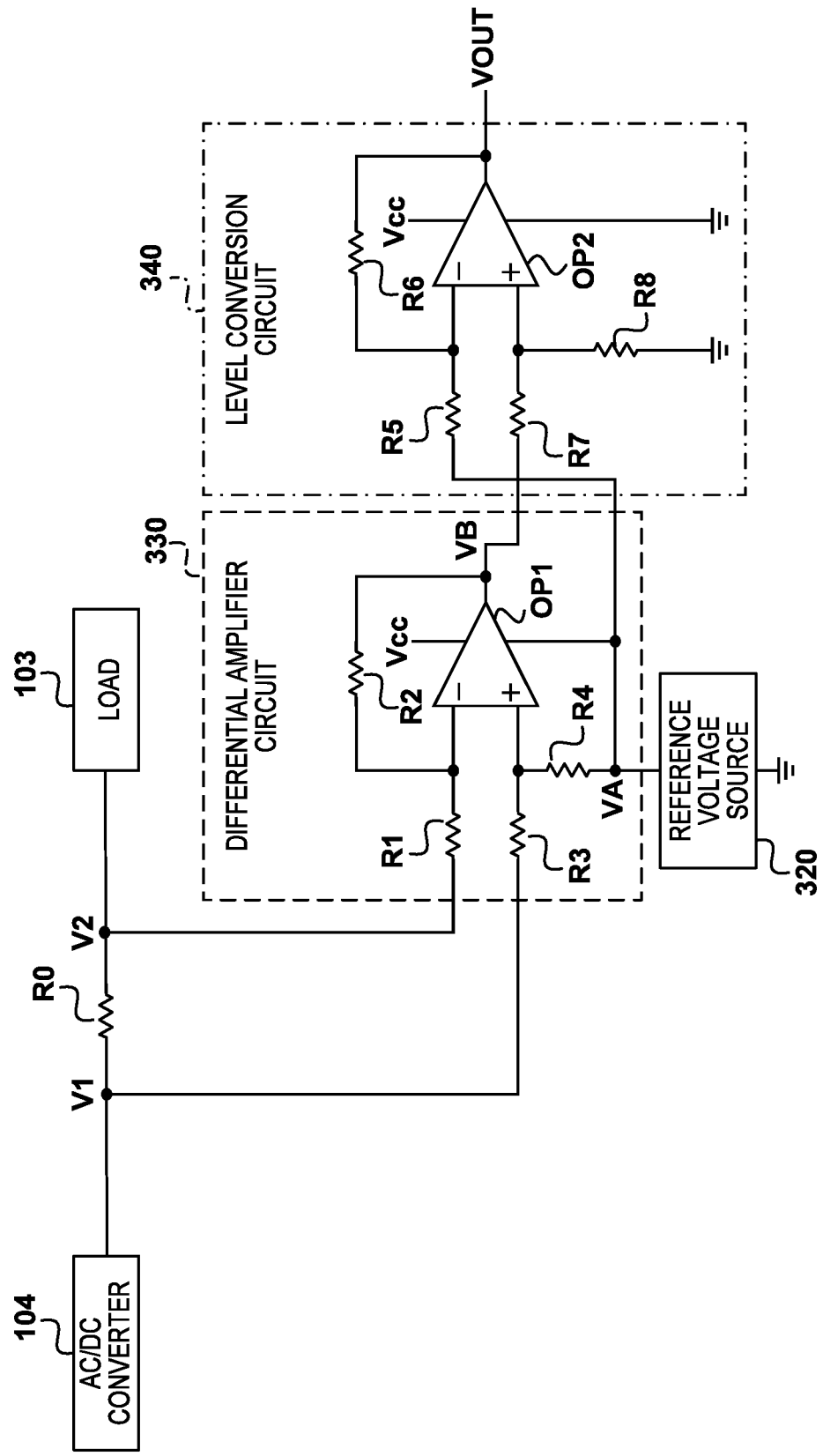
FIG. 3 is a diagram showing a current detection apparatus of an embodiment of the present invention.

As shown in FIG. 3, the current detection apparatus 105 of an embodiment of the present invention includes the shunt resistor R0, a reference voltage source 320, a differential amplifier circuit 330, and a level conversion circuit 340. In FIG. 3, the same reference signs are assigned to the items same as those in FIG. 2, and a description thereof is omitted. The reference voltage source 320 supplies a reference voltage VA to the differential amplifier circuit 330 and the level conversion circuit 340. The differential amplifier circuit 330 amplifies the difference voltage (V1−V2) so as to generate a voltage VB, and outputs the voltage VB to the level conversion circuit 340. The level conversion circuit 340 converts the level of the voltage VB so as to generate an output voltage VOUT, and outputs the output voltage VOUT.

The differential amplifier circuit 330 includes resistors R1, R2, R3, and R4, and an operational amplifier OP1. One end of the resistor R1 is connected to the other end of the shunt resistor R0. The other end of the resistor R1 is connected to one end of the resistor R2 and the inverting input terminal of the operational amplifier OP1. The one end of the resistor R2 is connected to the inverting input terminal of the operational amplifier OP1. The other end of the resistor R2 is connected to the output terminal of the operational amplifier OP1. One end of the resistor R3 is connected to the one end of the shunt resistor R0. The other end of the resistor R3 is connected to the non-inverting input terminal of the operational amplifier OP1 and one end of the resistor R4. The other end of the resistor R4 is connected to the reference voltage source 320.

The level conversion circuit 340 includes resistors R5, R6, R7, and R8, and an operational amplifier OP2. One end of the resistor R5 is connected to the reference voltage source 320. The other end of the resistor R5 is connected to one end of the resistor R6 and the inverting input terminal of the operational amplifier OP2. The one end of the resistor R6 is connected to the inverting input terminal of the operational amplifier OP2. The other end of the resistor R6 is connected to the output terminal of the operational amplifier OP2. One end of the resistor R7 is connected to the output terminal of the operational amplifier OP1. The other end of the resistor R7 is connected to one end of the resistor R8 and the non-inverting input terminal of the operational amplifier OP2. The other end of the resistor R8 is grounded. The negative power supply terminal of the operational amplifier OP2 is grounded.

Letting the resistance value of the shunt resistor R0 be R0, and the load current be IOUT, Expression 2 holds.

$$V1-V2=R0 \cdot IOUT \quad (2)$$

One end of the reference voltage source 320 is connected to GND (ground potential). The other end of the reference voltage source 320 is connected to the negative power supply terminal of the operational amplifier OP1 provided in the differential amplifier circuit 330. The reference voltage source 320 may be constituted by a constant voltage element such as a Zener diode or a shunt regulator. The reference voltage VA is an output voltage of the reference voltage source 320. When a voltage that is input to the inverting input terminal of the operational amplifier OP1 and a voltage that is input to the non-inverting input terminal exceed the withstand voltage of the operational amplifier OP1, the reference voltage source 320 is necessary. This is because a voltage that is higher than the withstand voltage of the operational amplifier OP1 cannot be applied to the inverting input terminal and non-inverting input terminal of the operational amplifier OP1. In view of this, as a result of applying the reference voltage VA to the negative power supply terminal of the operational amplifier OP1, the reference potential of the operational amplifier OP1 is offset by VA. Note that VA takes a positive value. In addition, a Vcc voltage obtained from the AC/DC converter 104 is input to the positive power supply terminal of the operational amplifier OP1. As a result, the differential amplifier circuit 330 outputs a voltage equivalent to the sum of the reference voltage VA and a voltage obtained by performing differential amplification on the voltage V1 and the voltage V2. Accordingly, a voltage equivalent to a value obtained by offsetting, by a voltage VA, the voltage obtained by performing differential amplification is output as the voltage VB. As a result, the difference between the reference potential of the operational amplifier OP1 and the voltage that is input to the inverting input terminal of the operational amplifier OP1 becomes smaller. Similarly, the difference between the reference potential and the voltage that is input to the non-inverting input terminal becomes smaller. Thus, a voltage exceeding the withstand voltage of the operational amplifier OP1 can be input to the inverting input terminal and non-inverting input terminal of the operational amplifier OP1.

As an example, assume that the voltage V1 is 40 V, the withstand voltage of the operational amplifier OP1 is 32 V, the resistance value R3 of the resistor R3 is 1 kΩ, the resistance value R4 of the resistor R4 is 10 kΩ, and the reference voltage VA is 20 V. In this case, the voltage that is input to the non-inverting input terminal of the operational amplifier OP1, when considered based on the reference potential of the operational amplifier OP1, is 18.18 V. This is lower than the withstand voltage of the operational amplifier OP1. Similarly, the voltage that is applied to the inverting input terminal of the operational amplifier OP1 is also lower than the withstand voltage of the operational amplifier OP1.

An output voltage VB of the operational amplifier OP1 is represented as Expression 3 below:

$$VB=\{(R1+R2)/R1\} \cdot \{R4/(R3+R4)\} \cdot V1-(R2/R1) \cdot V2+VA \quad (3)$$

The resistance value of a resistor Ri is represented as Ri (i is 1 to 4). Here, assume that the resistance value R1 and the resistance value R3 are set to the same resistance value Ra, and the resistance value R2 and the resistance value R4 are also set to the same resistance value Rb. In this case, the output voltage VB of the operational amplifier OP1 is represented as Expression 4.

$$VB=(Rb/Ra) \cdot (V1-V2)+VA \quad (4)$$

If the resistance value Rb is higher than the resistance value Ra, the voltage VB is a voltage obtained by offsetting, by the reference voltage VA, a voltage obtained by amplifying the difference voltage (V1−V2) of the shunt resistor R0. Here, a voltage proportional to the load current IOUT is a voltage obtained by amplifying the difference voltage (V1−V2), and thus the reference voltage VA needs to be removed from the voltage VB. Therefore, the level conversion circuit 340 is necessary. The output voltage VOUT of the operational amplifier OP2 is represented as Expression 5.

$$VOUT=\{(R5+R6)/R5\} \cdot \{R8/(R7+R8)\} \cdot VB-(R6/R5) \cdot VA \quad (5)$$

The resistance value of the resistor Ri is represented as Ri (i is 5 to 8). Here, assume that the resistance value R5 and resistance value R7 are set to the same resistance value Rc, and the resistance value R6 and the resistance value R8 are set to the same resistance value Rd. In this case, the output voltage VOUT is represented as Expression 6.

$$VOUT=(Rd/Rc)\cdot(VB-VA) \quad (6)$$

If Expression 6 is deformed using Expression 4, Expression 7 is obtained.

$$VOUT=(Rd/Re)\cdot(Rb/Ra)\cdot(V1-V2) \quad (7)$$

Expression 7 indicates that the voltage VA is removed from the voltage VB and the output voltage VOUT is obtained by providing the level conversion circuit 340.

Furthermore, if Expression 7 is deformed using Expression 2, Expression 8 is obtained.

$$VOUT=(Rd/Rc)\cdot(Rb/Ra)\cdot R0\cdot IOUT \quad (8)$$

Expression 8 indicates that the output voltage VOUT of the level conversion circuit 340 is proportional to the load current IOUT. Thus, it can be seen that the current detection apparatus 105 of an embodiment of the present invention can also detect the load current IOUT.

Current Detection Accuracy of Embodiment

As an example, assume that the voltage V1 is 40 V, the voltage VA is 20 V, and the difference voltage (V1−V2) is 0.5 V. Assume that the resistance errors of the resistors provided in the differential amplifier circuit 330 and the level conversion circuit 340 are 0.5%. Furthermore, assume that the resistance values of the resistors of the differential amplifier circuit 330 and the level conversion circuit 340 are set such that the output voltage VOUT is 5 V, by multiplying 0.5 V, which is a voltage drop component in the shunt resistor R0, by 10. As an example, assume that the resistance values of the resistor R1 and the resistor R3 are 1 kΩ, the resistance values of the resistor R2 and the resistor R4 are 10 kΩ, and the resistance values of the resistors R5 to R8 are 1 kΩ. As described above, the resistance error of the shunt resistor R0 is ignored.

The voltage VB is obtained as 25 V based on Expression 3. The output voltage VOUT is obtained as 5 V based on Expression 5. Here, the output voltage VOUT is recalculated in consideration of the resistance errors of the resistors provided in the differential amplifier circuit 330 and the level conversion circuit 340. When the voltage VB is the maximum of a variation range, the resistance value of the resistor R1 is 1.005 kΩ, the resistance value of the resistor R2 is 9.95 kΩ, the resistance value of the resistor R3 is 0.995 kΩ, and the resistance value of the resistor R4 is 10.05 kΩ. In this case, the voltage VB is calculated to be 25.67 V based on Expression 3. On the other hand, when the voltage VB is the minimum of the variation range, the resistance value of the resistor R1 is 0.995 kΩ, the resistance value of the resistor R2 is 10.05 kΩ, the resistance value of the resistor R3 is 1.005 kΩ, and the resistance value of the resistor R4 is 9.95 kΩ. In this case, the voltage VB is calculated to be 25.32 V based on Expression 3.

When the output voltage VOUT is the maximum of the variation range, the resistance values of the resistor R5 and the resistor R8 are 1.005 kΩ, the resistance values of the resistor R6 and the resistor R7 are 0.995 kΩ, and the voltage VB is the maximum value, which is 25.67 V. In this case, the output voltage VOUT is calculated to be 5.87 V based on Expression 5. On the other hand, when the output voltage VOUT is the minimum of the variation range, the resistance values of the resistor R5 and the resistor R8 are 0.995 kΩ, the resistance values of the resistor R6 and the resistor R7 are 1.005 kΩ, and the voltage VB is minimum value, which is 25.32 V. In this case, the output voltage VOUT is calculated to be 4.12 V based on Expression 5.

The true value of the output voltage VOUT is 5 V, and thus the error rate of current detection of the embodiment is calculated to be −17.69 to 17.40%. The error rate of current detection of the comparison example is −86.95 to 85.30%. Thus, the current detection accuracy of an embodiment of the present invention is improved largely relative to the current detection accuracy of the comparison example.

Image Forming Apparatus

Figure 4:
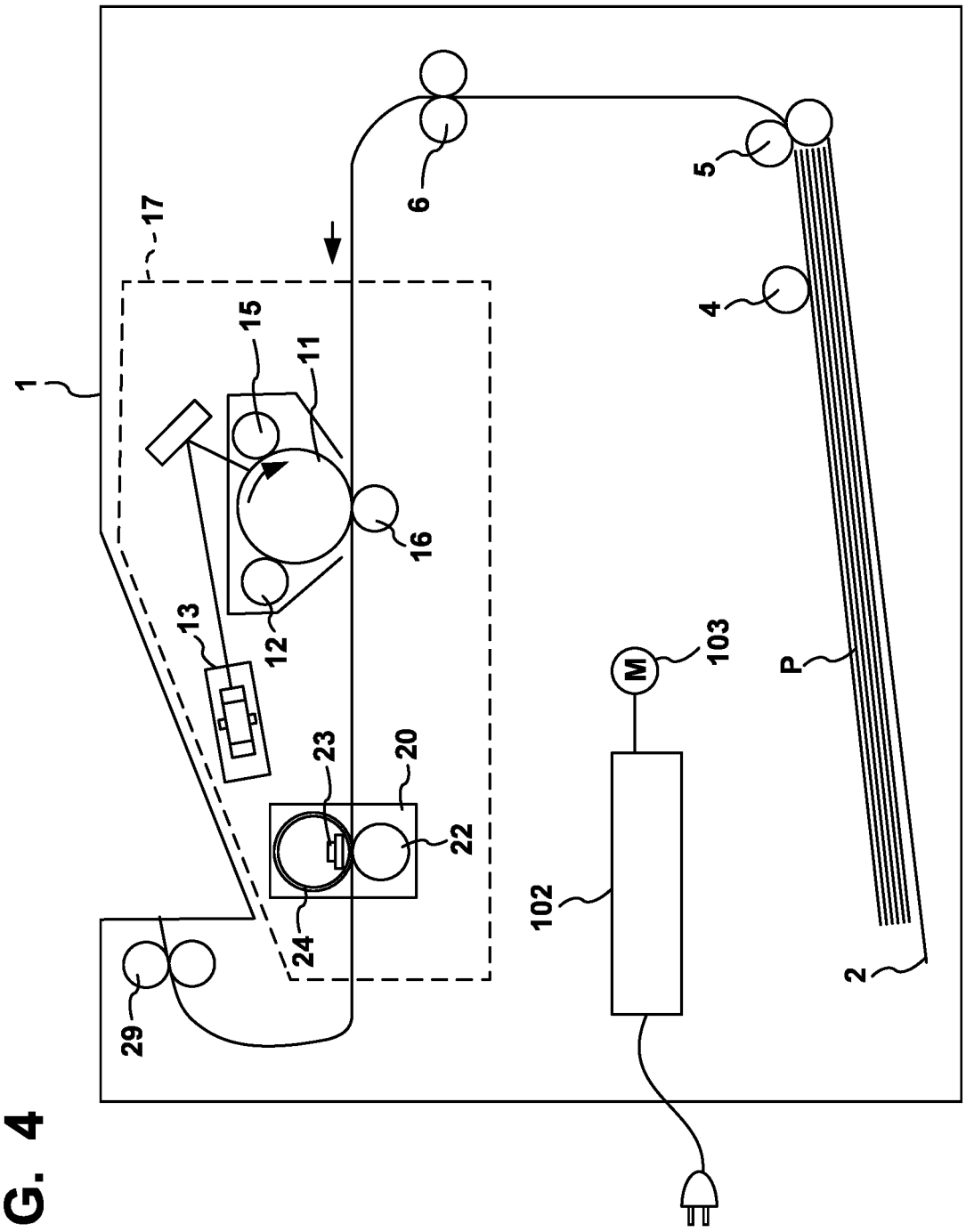
FIG. 4 is a diagram showing an example of a load.

FIG. 4 shows an electrophotographic image forming apparatus 1. A feeding cassette 2 is housing unit for housing a recording member P. A sheet feeding roller 4 is supply unit for delivering the recording member P to a conveyance path so as to supply the recording member P to an image forming unit 17. A pair of conveyance rollers 5 for conveying the recording member P and a pair of resistance rollers 6 are provided in the conveyance path. The image forming unit 17 is provided with a photosensitive drum 11 that supports an electrostatic latent image and a toner image. A charging roller 12 uniformly charges the surface of the photosensitive drum 11. An exposure unit 13 modulates a laser beam using image signals corresponding to an input image, and deflects the laser beam. Accordingly, the laser beam scans the surface of the photosensitive drum 11, and an electrostatic latent image is formed. A developing roller 15 develops the electrostatic latent image using toner, and forms a toner image. A transfer roller 16 transfers the toner image conveyed from the photosensitive drum 11, onto the recording member P. A fixing device 20 applies heat and pressure to the toner image transferred onto the recording member P while conveying the recording member P, and fixes the toner image to the recording member P. A pressing roller 22 is biased so as to abut on a fixing film 24. A heater 23 abuts on the inner circumferential surface of the cylindrical fixing film 24, and applies heat so as to increase the fixing temperature of the fixing film 24 to a target temperature. Paper discharge rollers 29 discharge the recording member P onto which the toner image was fixed by the fixing device 20. Here, the load 103 is a motor that operates using a DC voltage, and drives the pair of conveyance rollers 5, the pair of resistance rollers 6, the paper discharge rollers 29, and the like. For example, a voltage of 48 V is supplied from the power supply apparatus 102 to such a motor. The current detection apparatus 105 detects a drive current flowing to the motor.

Technical Idea Derived From Embodiment

As shown in FIG. 3, the shunt resistor R0 is an example of a shunt resistor connected in series to the load 103. The differential amplifier circuit 330 functions as an amplification circuit. For example, a first voltage (e.g., V1) that is generated at one end of the shunt resistor and a second voltage (e.g., V2) that is generated at the other end of the shunt resistor are input to the amplification circuit, and the amplification circuit performs differential amplification on the first voltage and the second voltage, and outputs a voltage correlated with a load current (e.g., IOUT) flowing to a load. The reference voltage source 320 functions as a voltage source that generates the reference voltage VA. The level conversion circuit 340 functions as a conversion circuit that is connected downstream of the differential amplifier circuit, and converts the level of the voltage that is output from the differential amplifier circuit. The differential amplifier circuit may include a first operational amplifier (e.g., OP1). The differential amplifier circuit 330 may also be configured to output a voltage equivalent to the sum of the reference voltage (e.g., VA) and a voltage obtained by performing differential amplification on the first voltage and the second voltage. The level conversion circuit 340 may also be configured to output the voltage obtained by performing differential amplification on the first voltage and the second voltage, the voltage being proportional to the load current flowing to the load, by removing the reference voltage from the voltage equivalent to the sum. Accordingly, the current detection accuracy of the current detection apparatus 105 improves.

The reference voltage source may also be configured to apply the reference voltage (e.g., VA) to the negative power supply terminal of the first operational amplifier. Accordingly, the reference potential of the first operational amplifier is offset, and thereby a high voltage can be applied to the inverting input terminal and the non-inverting input terminal of the first operational amplifier.

As shown in FIG. 3, the differential amplifier circuit may include a first resistor, a second resistor, a third resistor, and a fourth resistor (e.g., R1 to R4). The first operational amplifier includes an inverting input terminal, a non-inverting input terminal, and a negative power supply terminal. The first resistor (e.g., R1) is connected between the inverting input terminal of the first operational amplifier and the other end of the shunt resistor. The second resistor (e.g., R2) is connected between the inverting input terminal of the first operational amplifier and the output terminal of the first operational amplifier. The third resistor (e.g., R3) is connected between the non-inverting input terminal of the first operational amplifier and the one end of the shunt resistor. The fourth resistor (e.g., R4) is connected between the voltage source (e.g., the reference voltage source 320) and a connection point at which the third resistor and the non-inverting input terminal of the first operational amplifier are connected.

The conversion circuit (e.g., the level conversion circuit 340) may also be configured to remove the reference voltage from the voltage that is output from the differential amplifier circuit. When the reference voltage is applied to the negative power supply terminal, the output voltage of the first operational amplifier is also offset similarly. In view of this, the load current can be more accurately detected by removing the reference voltage from the output voltage of the first operational amplifier using the level conversion circuit.

The conversion circuit (e.g., the level conversion circuit 340) may include a fifth resistor, a sixth resistor, a seventh resistor, and an eighth resistor (e.g., R5 to R8), and a second operational amplifier (e.g., OP2). The fifth resistor (e.g., R5) is connected between the reference voltage source and the inverting input terminal of the second operational amplifier. The sixth resistor (e.g., R6) is connected between the inverting input terminal of the second operational amplifier and the output terminal of the second operational amplifier. The seventh resistor (e.g., R7) is connected between the output terminal of the first operational amplifier and the non-inverting input terminal of the second operational amplifier. The eighth resistor (e.g., R8) is connected between the non-inverting input terminal of the second operational amplifier and the ground potential. The resistance value of the fifth resistor, the resistance value of the sixth resistor, the resistance value of the seventh resistor, and the resistance value of the eighth resistor are set such that the reference voltage is offset by the voltage that is output from the differential amplifier circuit. Since the reference voltage is offset, the load current can be more accurately detected.

The differential amplifier circuit may also be configured to output a voltage (e.g., VB) equivalent to the sum of the reference voltage (e.g., VA) and the voltage obtained by performing differential amplification on the first voltage and the second voltage. The conversion circuit may also be configured to output the voltage obtained by performing differential amplification on the first voltage and second voltage (a voltage proportional to the load current IOUT), by removing the reference voltage from the voltage equivalent to the sum.

The current detection apparatus 105 may include a shunt resistor, a differential amplifier circuit, and a reference voltage source. In this case, the differential amplifier circuit may include a first resistor, a second resistor, a third resistor, a fourth resistor, and a first operational amplifier. The first operational amplifier may include an inverting input terminal, a non-inverting input terminal, and a negative power supply terminal. The first resistor is connected between the inverting input terminal of the first operational amplifier and the other end of the shunt resistor. The second resistor is connected between the inverting input terminal of the first operational amplifier and the output terminal of the first operational amplifier. The third resistor is connected between the non-inverting input terminal of the first operational amplifier and the one end of the shunt resistor. The fourth resistor is connected between the reference voltage source and a connection point at which the third resistor and the non-inverting input terminal of the first operational amplifier are connected. The reference voltage source is configured to apply the reference voltage to the negative power supply terminal of the first operational amplifier. Accordingly, the reference potential of the first operational amplifier is offset, and thereby a high voltage can be applied to the inverting input terminal and the non-inverting input terminal of the first operational amplifier. Note that, when the reference voltage VA is sufficiently low, the level conversion circuit 340 may be omitted.

As shown in FIG. 3, the current detection apparatus 105 may include a shunt resistor, a differential amplifier circuit, a reference voltage source, and a conversion circuit. The reference voltage source may be configured to apply a reference voltage to the negative power supply terminal of the first operational amplifier. The resistance values of the fifth resistor, the sixth resistor, the seventh resistor, and the eighth resistor may be set such that the reference voltage is offset by a voltage that is output from the differential amplifier circuit. Accordingly, a high voltage can be applied to the inverting input terminal and non-inverting input terminal of the first operational amplifier, and the current detection accuracy improves.

The withstand voltage of the inverting input terminal of the first operational amplifier is lower than the first voltage. In such a case, the reference voltage source 320 is necessary. As a result of applying the reference voltage from the reference voltage source to the negative power supply terminal of the first operational amplifier, the first voltage is offset by the reference voltage, and a voltage that is applied to the non-inverting input terminal of the first operational amplifier does not exceed the withstand voltage of the non-inverting input terminal.

The withstand voltage of the non-inverting input terminal of the first operational amplifier is lower than the second voltage. In such a case, the reference voltage source 320 is necessary. As a result of applying the reference voltage from the reference voltage source to the negative power supply terminal of the first operational amplifier, and the second voltage is offset by the reference voltage, the voltage that is applied to the inverting input terminal of the first operational amplifier does not exceed the withstand voltage of the inverting input terminal.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2020-009445, filed Jan. 23, 2020 which is hereby incorporated by reference herein in its entirety.

What is claimed is:

1. A current detection apparatus comprising:
a shunt resistor that is connected in series to a load;
a differential amplifier circuit to which a first voltage that is generated at one end of the shunt resistor and a second voltage that is generated at the other end of the shunt resistor are input, and that performs differential amplification on the first voltage and the second voltage, and outputs a voltage correlated with a load current flowing to the load;
a reference voltage source that generates a reference voltage; and
a conversion circuit that is connected downstream of the differential amplifier circuit, and converts a level of a voltage that is output from the differential amplifier circuit,
wherein the differential amplifier circuit includes a first operational amplifier that includes a negative power supply terminal to which the reference voltage is applied from the reference voltage source, and the differential amplifier circuit is configured to output a third voltage equivalent to a sum of the reference voltage and a voltage obtained by performing differential amplification on the first voltage and the second voltage, and
the conversion circuit is configured to output the voltage obtained by performing differential amplification on the first voltage and the second voltage, the voltage being proportional to the load current, by removing the reference voltage from the third voltage.

2. The current detection apparatus according to claim 1, wherein
the differential amplifier circuit further includes a first resistor, a second resistor, a third resistor, and a fourth resistor,
the first resistor is connected between an inverting input terminal of the first operational amplifier and the other end of the shunt resistor,
the second resistor is connected between the inverting input terminal of the first operational amplifier and an output terminal of the first operational amplifier,
the third resistor is connected between a non-inverting input terminal of the first operational amplifier and the one end of the shunt resistor, and
the fourth resistor is connected between the reference voltage source and a connection point at which the third resistor and the non-inverting input terminal of the first operational amplifier are connected.

3. The current detection apparatus according to claim 2, wherein
the conversion circuit is configured to remove the reference voltage from a voltage that is output from the differential amplifier circuit.

4. The current detection apparatus according to claim 3, wherein
the conversion circuit includes a fifth resistor, a sixth resistor, a seventh resistor, an eighth resistor, and a second operational amplifier, and
the fifth resistor is connected between the reference voltage source and an inverting input terminal of the second operational amplifier,
the sixth resistor is connected between the inverting input terminal of the second operational amplifier and an output terminal of the second operational amplifier,
the seventh resistor is connected between the output terminal of the first operational amplifier and a non-inverting input terminal of the second operational amplifier,
the eighth resistor is connected between the non-inverting input terminal of the second operational amplifier and a ground potential, and
a resistance value of the fifth resistor, a resistance value of the sixth resistor, a resistance value of the seventh resistor, and a resistance value of the eighth resistor are set such that the reference voltage is offset by the voltage that is output from the differential amplifier circuit.

5. The current detection apparatus according to claim 3, wherein
the conversion circuit is configured to output a voltage obtained by performing differential amplification on the first voltage and the second voltage, by removing the reference voltage from a voltage equivalent to the sum.

6. The current detection apparatus according to claim 2, wherein
a withstand voltage of the inverting input terminal of the first operational amplifier is lower than the first voltage.

7. The current detection apparatus according to claim 2, wherein
the withstand voltage of the non-inverting input terminal of the first operational amplifier is lower than the second voltage.

8. The current detection apparatus according to claim 7, wherein
as a result of applying the reference voltage from the reference voltage source to the negative power supply terminal of the first operational amplifier, the second voltage is offset by the reference voltage, and a voltage that is applied to the inverting input terminal of the first operational amplifier does not exceed the withstand voltage of the inverting input terminal.

9. A current detection apparatus comprising:
a shunt resistor that is connected in series to a load;
a differential amplifier circuit to which a first voltage that is generated at one end of the shunt resistor and a second voltage that is generated at the other end of the shunt resistor are input, and that performs differential amplification on the first voltage and the second voltage, and outputs a voltage correlated with a load current flowing to the load; and
a reference voltage source that generates a reference voltage; and
wherein the differential amplifier circuit includes a first resistor, a second resistor, a third resistor, a fourth resistor, and an operational amplifier,
the first resistor is connected between an inverting input terminal of the operational amplifier and the other end of the shunt resistor,
the second resistor is connected between the inverting input terminal of the operational amplifier and an output terminal of the operational amplifier,
the third resistor is connected between a non-inverting input terminal of the operational amplifier and the one end of the shunt resistor,
the fourth resistor is connected between the reference voltage source and a connection point at which the third resistor and the non-inverting input terminal of the operational amplifier are connected, and
the reference voltage source is configured to apply the reference voltage to a negative power supply terminal of the operational amplifier.

10. A current detection apparatus comprising:
a shunt resistor that is connected in series to a load;
a differential amplifier circuit to which a first voltage that is generated at one end of the shunt resistor and a second voltage that is generated at the other end of the shunt resistor are input, and that performs differential amplification on the first voltage and the second voltage, and outputs a voltage correlated with a load current flowing to the load;
a reference voltage source that generates a reference voltage; and
a conversion circuit that is connected downstream of the differential amplifier circuit, and converts a level of a voltage that is output from the differential amplifier circuit,
wherein the differential amplifier circuit includes an operational amplifier that includes a negative power supply terminal to which the reference voltage is applied from the reference voltage source, and the differential amplifier circuit is configured to output a voltage equivalent to a sum of the reference voltage and a voltage obtained by performing differential amplification on the first voltage and the second voltage, and
the conversion circuit is configured to output the voltage obtained by performing differential amplification on the first voltage and the second voltage, the voltage being proportional to a load current flowing to the load, by removing the reference voltage from the voltage equivalent to the sum.

11. The current detection apparatus according to claim 6, wherein
as a result of applying the reference voltage from the reference voltage source to the negative power supply terminal of the first operational amplifier, the first voltage is offset by the reference voltage, and a voltage that is applied to the non-inverting input terminal of the first operational amplifier does not exceed the withstand voltage of the non-inverting input terminal.

12. A power supply comprising:
a power supply circuit that supplies a current to a load; and
a current detection apparatus that detects a current flowing to the load, wherein the current detection apparatus comprising:
a shunt resistor that is connected in series to a load;
a differential amplifier circuit to which a first voltage that is generated at one end of the shunt resistor and a second voltage that is generated at the other end of the shunt resistor are input, and that performs differential amplification on the first voltage and the second voltage, and outputs a voltage correlated with a load current flowing to the load;
a reference voltage source that generates a reference voltage; and
a conversion circuit that is connected downstream of the differential amplifier circuit, and converts a level of a voltage that is output from the differential amplifier circuit,
wherein the differential amplifier circuit includes an operational amplifier that includes a negative power supply terminal to which the reference voltage is applied from the reference voltage source, and the differential amplifier circuit is configured to output a voltage equivalent to a sum of the reference voltage and a voltage obtained by performing differential amplification on the first voltage and the second voltage, and
the conversion circuit is configured to output the voltage obtained by performing differential amplification on the first voltage and the second voltage, the voltage being proportional to the load current, by removing the reference voltage from the voltage equivalent to the sum.

* * * * *